United States Patent [19]

Kimura

[11] Patent Number: 5,777,515
[45] Date of Patent: Jul. 7, 1998

[54] OPERATIONAL AMPLIFIER APPARATUS

[75] Inventor: Hiroshi Kimura, Amagasaki, Japan

[73] Assignee: Matsushita Electric Industrial Co., Ltd., Kadoma, Japan

[21] Appl. No.: 646,623

[22] Filed: May 8, 1996

[30] Foreign Application Priority Data

May 11, 1995 [JP] Japan ................................ 7-112899

[51] Int. Cl.$^6$ ........................................................ H03F 3/45
[52] U.S. Cl. ........................................... 330/257; 330/292
[58] Field of Search .................................. 330/252, 253, 330/257, 261, 292

[56] References Cited

U.S. PATENT DOCUMENTS 4,554,515  11/1985  Burson et al. ................. 330/257 X
4,766,394  8/1988  Yukawa ......................... 330/257 X

OTHER PUBLICATIONS

Degrauwe et al, IEEE Journal of Solid-State Circuits, vol. SC-17, No. 3, Jun. 1982, "Adaptive Biasing CMOS Amplifiers".

Klinke et al, IEEE Journal of Solid State Circuits, vol. 24, No. 3, Jun. 1989, "A Very High Slew Rate CMOS Opr. Amplifier".

*Primary Examiner*—Steven Mottola
*Attorney, Agent, or Firm*—Renner, Otto, Boisselle & Sklar, P.L.L.

[57] ABSTRACT

According to the present invention, an operational amplifier apparatus for outputting to an output terminal a voltage corresponding to a difference between a voltage in a first input terminal and a voltage in a second input terminal is provided. The operational amplifier apparatus includes an operational amplifying section for outputting to the output terminal a voltage corresponding to (V2−V1), where V1 is the voltage in the first input terminal, V2 is the voltage in the second input terminal and k is a constant and a current supply section for supplying a current corresponding to the difference between the voltage in the first input terminal and the voltage in the second input terminal. In the operational amplifier apparatus, the current supply section supplies a current to at least one of a capacitor included in the operational amplifying section and the output terminal, thereby increasing a slew rate.

9 Claims, 14 Drawing Sheets

OPERATIONAL AMPLIFIER APPARATUS

BACKGROUND OF THE INVENTION

1. Field of the Invention

The present invention relates to an operational amplifier apparatus. More specifically, the present invention relates to an operational amplifier apparatus, such an a liquid crystal driver, for driving a large load at a low power consumption.

2. Description of the Related Art

In recent years, it has become more and more frequent that a liquid crystal panel is incorporated into a portable device. Thus, the reduction in the power consumption of a liquid crystal panel module has now become an important task to solve. FIG. 9 is a schematic representation of a driving system for a liquid crystal panel. An shown in FIG. 9, a plurality of liquid crystal driving large-scale integrated circuits (LSIs) are used for driving a liquid crystal panel. In the system shown in FIG. 9, a controller 97 controls gate drivers 91 and 92 and source drivers 93 to 96. Since it is only necessary for the gate drivers 91 and 92 to switch the gates of thin film transistors (TFTs), the amount of current to be consumed for the gate drivers are not necessarily so large. On the other hand, since the source drivers 93 to 96 supply signals for display to the respective pixels of a liquid crystal display panel, it is necessary to provide an operational amplifier apparatus for each output pin of the source drivers. As a result, the amount of current to be consumed for a source driver is far larger than that for a gate driver. For example, in the case where a source driver has 240 output pine or output terminals, 240 operational amplifier apparatuses are required to be provided therefor. Thus, in order to reduce the power consumption of a liquid crystal panel module, it is indispensable to drive the operational amplifier apparatuses at a lower power consumption.

FIG. 6 is a circuit diagram of a two-stage amplification type operational amplifier apparatus generally used for a liquid crystal driver and the like. An operational amplifier apparatus in which an input differential pair consists of p-type metal-oxide-semiconductor (PMOS) transistors is shown in FIG. 6. As shown in FIG. 6, the first stage amplifier is a differential amplifier consisting of a differential input section including transistors Q1 and Q2, the sources of which are coupled with each other, and a constant current source formed by a transistor Q3, and an active load formed by transistors Q4 and Q5. On the other hand, the second stage amplifier is generally an inverter amplifier consisting of an n-type metal-oxide-semiconductor (NMOS) transistor Q6, the source of which is grounded, and a PMOS transistor Q7 which is a constant current source load. In FIG. 6, Cc denotes a capacitor for phase compensation and CL denotes a load capacitance. Since an operational amplifier apparatus has an extremely high gain, the operational amplifier apparatus is generally used with a negative feedback configuration.

In a conventional operational amplifier apparatus having such a configuration, the slew rate when a large signal is input is determined by the smaller one of an internal slew rate SRin and an external slew rate SRex. The internal slew rate SRin is defined by the following Equation 1.

$$SRin=dV/dt=Io/Cc \quad (1)$$

where Io is a bias current of the first stage or the differential stage and Cc is a phase compensation capacitor. As represented by Equation 1, the internal slew rate is defined by a rate at which the bias current Io of the differential stage charges Cc. On the other hand, the external slew rats SRex is defined by the following Equation 2.

$$SRex=dV/dt=(Is-Io)/CL \quad (2)$$

where Is is a bias current of the inverter amplifier at the second stage and CL is the load capacitance. Therefore, when the load capacitance CL is small, the slew rate is determined by SRin. To the contrary, when the load capacitance CL is large, the slew rate is determined by SRex.

In any case, in order to improve the slew rate, it is necessary to increase the bias current Io or Is. The increase in the bias current not only considerably increases the power consumption but also degrades the small-signal characteristics of the operational amplifier apparatus. For example, a small-signal voltage gain Av at the differential stage is represented by the following Equation 3.

$$Av=gm2/(g2+g5) \quad (3)$$

where gm2 is a transconductance of the transistor Q2; g2 is an output conductance of the transistor Q2; and g5 is an output conductance of the transistor Q5. g2 and g5 increase in proportion to a current, whereas gm2 increases in proportion to the square root of the current. Thus, the small signal voltage gain Av decreases as the current increases.

Thus, as a first means for solving the above-described problem, an operational amplifier apparatus such as that shown in FIG. 7 has been proposed for an operational transconductance amplifier (OTA) (IEEE Journal of Solid-State Circuit., pp. 522–528, Vol. SC-17, No. 3, June 1982). Hereinafter, the operation of this operational amplifier apparatus will be described. Transistors Q11, Q13, Q14 and Q15 form a difference current amplifier circuit. The currents flowing through transistors Q10 and Q12 are assumed to be denoted by I10 and I12, respectively. When I10>I12, the transistor Q15 is turned OFF. On the other hand, when I10<I12, a current represented by A (I12–I10) flows through the transistor Q15 (where A denotes a mirror ratio of a current mirror formed by the transistors Q14 and Q15). Similarly, translators Q17, Q19, Q20 and Q21 are assumed to form a difference current amplifier circuit and the currents flowing through transistors Q16 and Q18 are assumed to be denoted by I16 and I18, respectively. Then, when I18>I16, a current represented by A (I18–I16) flows through the transistor Q21. In this case, the current flowing through the transistor Q6 is mirrored in I10 and I18 and the current flowing through the transistor Q7 is mirrored in I12 and I16. Consequently, a constant bias current is supplied in a steady state, whereas, when a difference is generated between the currents flowing through the transistors Q6 and Q7, a current corresponding to this difference current is added to the bias current, thereby improving the slew rate. Such a circuit has disadvantages in that the power consumption and the size thereof are considerably increased, because the current flowing through Q6 also flows through Q10 and Q18 end the current flowing through Q7 also flows through Q12 and Q16.

In addition, as a second means for solving the above-described problem, an operational amplifier apparatus such as that shown in FIG. 8 ham been proposed (IEEE Journal of Solid-State Circuits, pp. 744–746, Vol. 24, No. 3, June 1989). The sizes of the transistors Q12, Q13 and Q14 are met such that both voltages of outputs A and B become LOW when the gate voltages of Q10 and Q11 are equal to each other. Therefore, in the steady state, both the transistors Q15 and Q16 are cut off and the differential input section is biased by a constant current supplied from the transistor Q3. Assuming that a large difference voltage is generated between the differential inputs Vin+ and Vin− (where Vin+ >Vin−), the node B becomes HIGH, thereby turning ON the transistor Q16 and the current flowing through Q16 is added to the bias current. On the other hand, when Vin−>Vin+, the transistor Q15 is turned ON. This operational amplifier apparatus can suppress the increase in the circuit size and the power consumption more than the above-described operational amplifier apparatus an the first means for solving the problems. However, the nodes A and B are nodes of a high impedance. Thus, when a difference voltage between the inputs exceeds a threshold value, the transistors Q15 and Q16 are instantaneously turned ON and the bias current abruptly increases or decreases, so that the settling characteristics are degraded and a noise is adversely caused.

SUMMARY OF THE INVENTION

According to the present invention, an operational amplifier apparatus for outputting to an output terminal a voltage corresponding to a difference between a voltage in a first input terminal and a voltage in a second input terminal is provided. The operational amplifier apparatus includes an operational amplifying section for outputting to the output terminal a voltage corresponding to (V2−V1), where V1 in the voltage in the first input terminal, V2 is the voltage in the second input terminal and k is a constant, and a current supply section for supplying a current corresponding to the difference between the voltage in the first input terminal and the voltage in the second input terminal. In the operational amplifier apparatus, the current supply section supplies a current to at least one of a capacitor included in the operational amplifying section and the output terminal, thereby increasing a slew rate.

In one embodiment, the current supply section does not supply a current when the voltage in the first input terminal is equal to the voltage in the second input terminal and supplies a current corresponding to the difference between the voltage in the first input terminal and the voltage in the second input terminal when the voltage in the first input terminal is not equal to the voltage in the second input terminal.

In another embodiment, the current supply section includes: a first transistor, a control terminal of which is connected to the first input terminal; a second transistor, a control terminal of which is connected to the second input terminal; and a current mirror circuit for supplying a current which is A times as large as a current flowing through terminals other than the control terminal of the second transistor.

In still another embodiment, a relationship W1/L1>W2/L2 (where a channel width and a channel length of the first transistor are denoted by W1 and L1, respectively, and a channel width and a channel length of the second transistor are denoted by W2 and L2, respectively) is satisfied.

In still another embodiment, a relationship Vt1<Vt2 (where threshold voltages of the first and the second transistors are denoted by Vt1 and Vt2, respectively) is satisfied.

In still another embodiment, the current supply section includes a transistor, a control terminal and one of terminals other than the control terminal of which are connected to one of the terminals other then the control terminal of the second transistor.

In still another embodiment, the current supply section includes a resistance connected to one of the terminals other than the control terminal of the second transistor.

In still another embodiment, a constant current source in connected to an input of the current mirror circuit.

In still another embodiment, the current supply section supplies a current to the capacitor included in the operational amplifying section and the output terminal.

Thus, the invention described herein makes possible the advantage of providing an operational amplifier apparatus which can improve a slew rate without considerably increasing the power consumption or degrading the small signal characteristics and the settling characteristics, or an operational amplifier apparatus which can drive a large load at a low power consumption.

This and other advantages of the present invention will become apparent to those skilled in the art upon reading and understanding the following detailed description with reference to the accompanying figures.

BRIEF DESCRIPTION OF THE DRAWINGS

FIG. 6 is a circuit diagram of a two-stage amplification type conventional operational amplifier apparatus generally used for a liquid crystal driver and the like.

DESCRIPTION OF THE PREFERRED EMBODIMENTS

Figure 1:
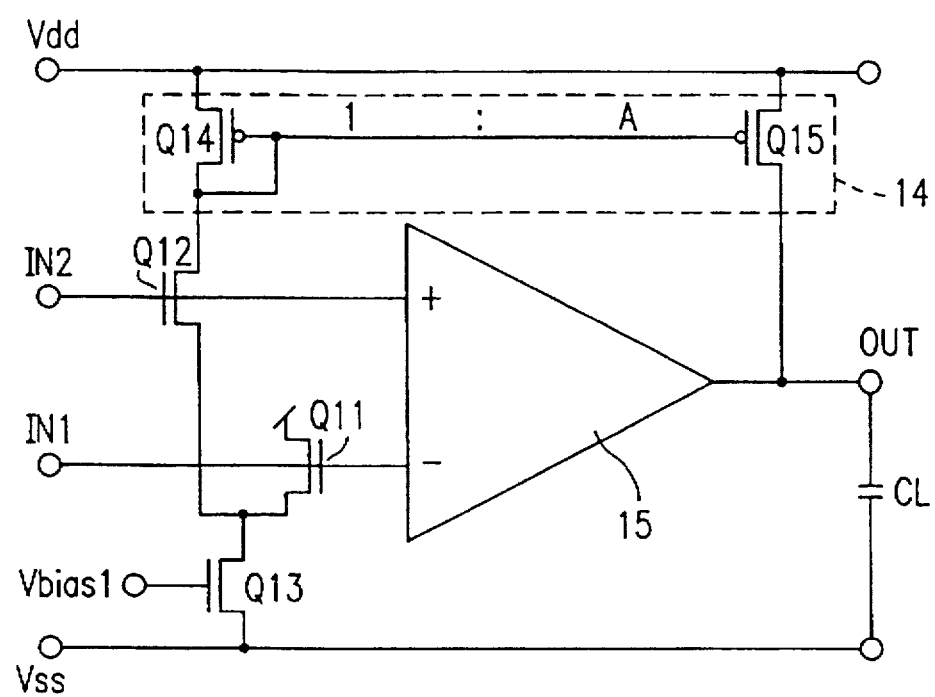
FIG. 1 is a circuit diagram of an operational amplifier apparatus in a first example according to the present invention.

Hereinafter, embodiments of the operational amplifier apparatus according to the present invention will be described with reference to the accompanying drawings, in which the same components will be identified by the same reference numerals. In the following examples, a line having a higher potential level of the two power supply line connected to the operational amplifier apparatus will be referred to as a "power supply Vdd" and the other line having a lower potential level will be referred to as a "ground Vss". A "voltage of a node" means a potential of the node with respect to the ground. In the embodiments of the operational amplifier apparatus according to the present invention, it is assumed that a load is heavy or the load capacitance connected to the output terminal of the operational amplifier apparatus determines a slew rate, but for some special limitation.

In this specification, a "slew rate" is a value obtained by differentiating a voltage of an output terminal with respect to time when a stepwise input signal is applied to the input terminals of the operational amplifier apparatus. A slew rate is one of the parameters representing various characteristics when a capacitive load is driven. In the case where a capacitance C connected to the output terminal is charged with a constant current I, the slew rate SR is defined as: SR=dV/dt=I/C and represented by (V/s). In order to improve the slew rate, it is necessary to increase the current I charging/discharging the capacitance C. The rise slew rate depends upon the level of the current I charging the capacitance C, while the fall slew rate depends upon the level of the current I discharging the capacitance C.

EXAMPLE 1

FIG. 1 is a circuit diagram of an operational amplifier apparatus in a first example according to the present invention. Nodes IN1 and IN2 respectively receive input signals and a node OUT outputs an output signal corresponding to the input signals. An inverted input terminal (denoted by n "−" in FIG. 1) and a non-inverted input terminal (denoted by "+" in FIG. 1) of the operational amplifying section 15 are connected to the nodes IN1 and IN2, respectively. The output terminal of the operational amplifying section 15 in connected to the nods OUT. In the all of the following examples, assuming that the voltages applied to the nodes IN1 and IN2 are denoted by VIN1 and VIN2, respectively, and the voltage output to the node OUT is denoted by VOUT in the operational amplifying section, a relationship: VOUT=k (VIN2−VIN1) (where k is a constant) is satisfied in the steady state. The operational amplifying section 15 can be implemented either as a part of an integrated circuit or as a discrete circuit.

A load capacitance CL is connected to the node OUT. This load capacitance CL is a capacitance which an external liquid crystal display device has, for example. The load capacitance CL can include a stray capacitance in the line connecting the node OUT and an external device to each other.

The nodes IN1 and IN2 are connected to the gates of the transistors Q11 and Q12, respectively. The sources of the transistors Q11 and Q12 are connected to the drain of the transistor Q13. Since a bins voltage Vbias1 is applied to the gate of the transistor Q13, the transistor Q13 functions as a constant current source for supplying a bias current to the transistors Q11 and Q12. The source of the transistor Q13 is connected to the ground Vss.

The transistors Q14 and Q15 are PMOS transistors and form a current mirror circuit 14 having a mirror ratio A. In other words, a ratio of the drain current of the transistor Q15 to the drain current of the transistor Q14 is equal to a. The gate and the drain of the transistor Q14 are connected to the drain of the transistor Q12 and the gate of the transistor Q15.

The drain of the transistor Q15 is connected to the node OUT of the operational amplifier apparatus. The sources of the transistors Q14 and Q15 are connected to the power supply Vdd.

First, a case where VIN1 is equal to VIN2 will be analyzed. In the following description, a channel width, a channel length and a threshold voltage of the transistor Q11 will be denoted by W1, L1 and Vt1, respectively, and a channel width, a channel length and a threshold voltage of the transistor Q12 will be denoted by W2, L2 and Vt2, respectively, for Illustrative purposes. In a virtual-short state or a state where VIN1=VIN2, if the drain current of the transistor Q13 functioning as a constant current source is equal to the drain current of the transistor Q11 (or the drain current of the transistor Q12 is zero), the effects of the present invention can be attained as will be described later. In order to realize such a state, a relationship: W1/L1>W2/L2 in preferably satisfied among the constants of the transistor Q11 and Q12. More preferably, a relationship: Vt1<Vt2 is satisfied.

In the came where the above-described two relationships are satisfied, the drain current of the transistor Q12 can be cut off so long as the virtual short is held. As a result, the drain current of the transistor Q15 also becomes zero and no current flows from the current mirror circuit 14 to the node OUT.

Next, a case where VIN1 is not equal to VIN2, e.g., a case where VIN2>VIN1, will be analyzed. When a difference voltage (VIN2−VIN1) exceeds a threshold value, a part of the drain current of the transistor Q13, all of which has been flowing through the transistor Q11 when VIN1=VIN2, begins to flow through the transistor Q12, too. The drain current of the transistor Q12 is amplified by A by the current mirror circuit 14 and then output to the node OUT. In other words, a current which is A times as large as the drain current of the transistor Q12 flown as a drain current through the transistor Q15 and than output to an external circuit via the node OUT. Therefore, in the operational amplifier apparatus according to the present invention, it is possible to supply a sum of the current output from the operational amplifying section 15 and the current output from the current mirror circuit 14 (more specifically, the transistor Q15) to an external circuit connected to the node OUT. As a result, a voltage can abruptly rise in the node OUT and the slew rate of the operational amplifier apparatus can be considerably improved.

In the above-described operational amplifier apparatus, the rise slew rate can be improved. In the case where the transistors in the differential inputs are PMOS transistors in a common two-stage amplification type operational amplifier apparatus, the rise slew rate is deteriorated. According to this example, this deterioration of the rise slew rate is improved. In this example, NMOS transistors are used as the transistors Q11 and Q12.

On the other hand, in order to improve the falling slew sate, it is only necessary to invert the polarities of the transistors and the power supply in the circuit shown in FIG. 1. This case corresponds to a case where the transistors in the differential inputs are NMOS transistors in a common two-stage amplification type operational amplifier apparatus. In the following examples, various embodiments of an operational amplifier apparatus which can advantageously improve a rise slew rate will be described. However, the falling slew rate can also be advantageously improved by inverting the polarities of the respective transistors and the power supply in the circuit shown in FIG. 1.

7

In the first example, the drain of the transistor Q15 is connected to the node OUT. As a result, the drain current of the transistor Q15 in the current mirror circuit 14 can contribute to charging the load capacitance CL in a shorter period of time. Not only the load capacitance CL connected to the node OUT but also a capacitor for phase compensation (to be described later) included in the operational amplifying section 15 can serve as factors for reducing the slew rate in the node OUT. The first example is applicable particularly effectively to a case where the load capacitance CL is larger than the capacitor for phase compensation. The load capacitance CL becomes larger then the capacitor for phase compensation, for example, when a liquid crystal display device is connected as a load to the node OUT.

In the all examples, the virtual-short state is a state where VIN1 is equal to VIN2, as will be appreciated.

EXAMPLE 2

Figure 2:
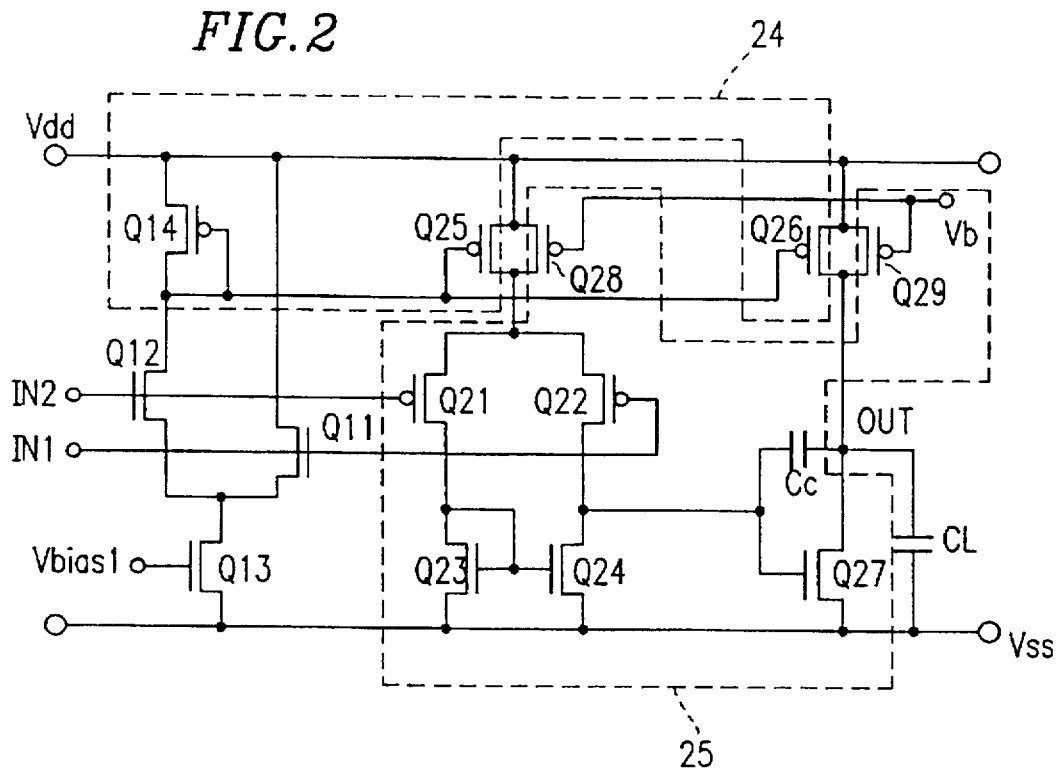
FIG. 2 is a circuit diagram of an operational amplifier apparatus in a second example according to the present invention.

FIG. 2 is a circuit diagram of an operational amplifier apparatus in a second example according to the present invention. An operational amplifying section 25 corresponds to the operational amplifying section 15. The operational amplifying section 25 consists of an input stage formed by transistors Q21 to Q24 and Q28 and an output stage formed by transistors Q27 and Q29.

A current mirror circuit 24 corresponds to the current mirror circuit 14. The transistor Q25 corresponds to the transistor Q15 and Increases the bias current of the transistors Q21 to Q24. As a result, the phase compensation capacitance Cc of the operational amplifying section 25 can be charged in a short period of time. The transistor Q26 also corresponds to the transistor Q15 and supplies a current to the load capacitance CL. As a result, the load capacitance CL can be charged in a short period of time.

In the second example, a current output from the current mirror circuit 24 is supplied to both of the phase compensation capacitance Cc and the load capacitance CL. Thus, the slew rate can be further improved advantageously as compared with the case whore a current is supplied to the load capacitance CL only.

The drain current of the transistor Q28 corresponds to Io in the Equations 1 and 2 described above and the drain current of the transistor Q29 corresponds to Is in the Equation 2 described above. When the slew rate SRin is smaller than the other slew rate SRex, the phase compensation capacitance Cc functions as a "capacitor determining the slew rate". On the other hand, when the slew rate SRex is smaller than the other slew rate SRin, the load capacitance CL functions as a "capacitor determining the slew rate".

According to the present invention, it is preferable for the current mirror circuit 24 to supply a current to the capacitor determining the slew rate. Therefore, if the slew rates SRin and SRex are at similar levels, it is preferable for the current mirror circuit 24 to supply a current to both of the phase compensation capacitance Cc and the load capacitance CL as in this second example.

EXAMPLE 3

Figure 3:
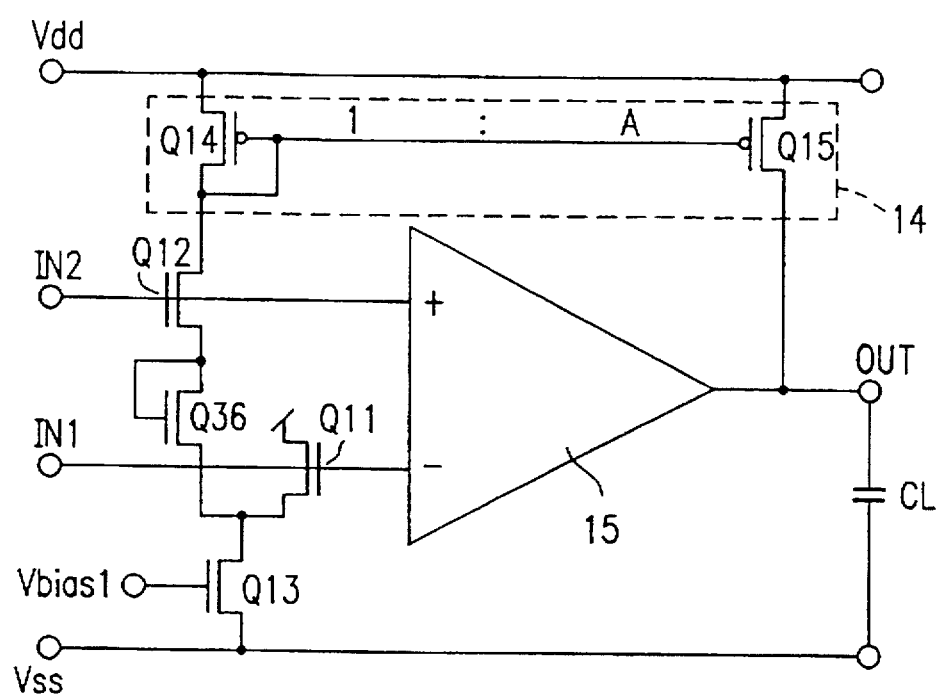
FIG. 3 is a circuit diagram of an operational amplifier apparatus in a third example according to the present invention.

FIG. 3 is a circuit diagram of an operational amplifier apparatus in a third example according to the present invention. The circuit of the third example has the same configuration as that of the circuit of the first example, except that a transistor Q36 is additionally provided between the transistors Q12 and Q13. The gate of the transistor Q36 is connected to the drain of the transistor Q36. Such a connection is also called a "diode connection". The gate and the drain of the transistor Q36 are connected to the source of the transistor Q12. The source of the transistor Q36 in connected to the drain of the transistor Q13.

Since the circuit of the third example operates in substantially the same way as the circuit of the first example, only the operation, different from that of the first example, resulting from the addition of the transistor Q36 will be described below.

In a steady state (or a state where a virtual short is held), a voltage between the gate and the source of the transistor Q12 does not exceed a predetermined threshold value because of the diode-connected transistor Q36, so that the transistor Q12 is cut off. Since the drain current of the transistor Q12 does not flow, the current mirror circuit 14 does not supply a current to the nods OUT. In this case, by providing the transistor Q36, the following effects can be attained: when the virtual short is hold, the current mirror circuit is completely cut off by the translator Q36.

EXAMPLE 4

Figure 4:
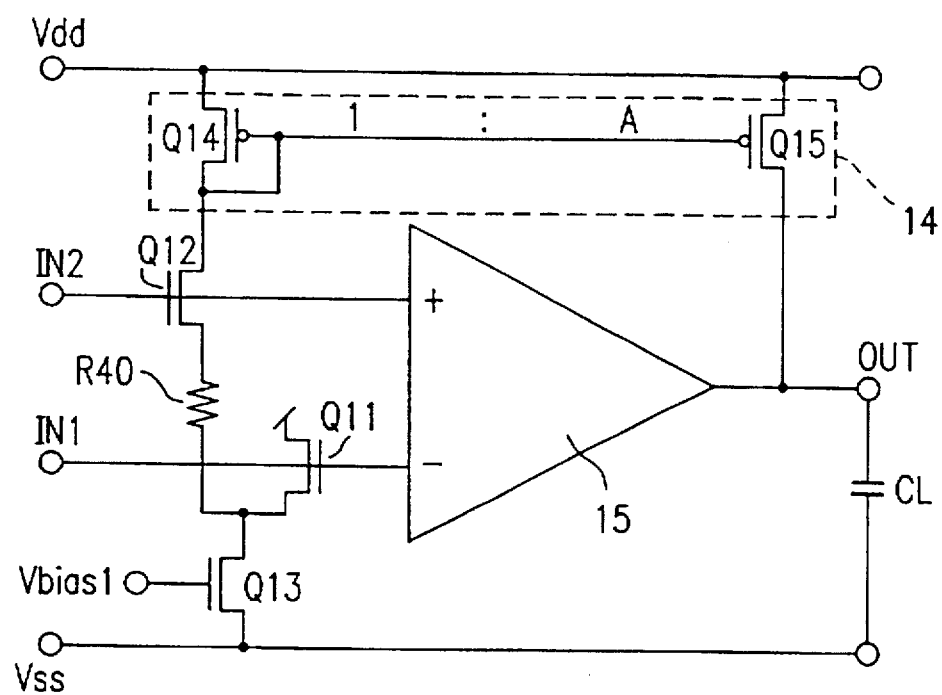
FIG. 4 in a circuit diagram of an operational amplifier apparatus in a fourth example according to the present invention.

FIG. 4 is a circuit diagram of an operational amplifier apparatus in a fourth example according to the present invention. The circuit of the fourth example has the same configuration as that of the circuit of the first example, except that a resistance R40 in provided between the transistors Q12 and Q13. One end of the resistance R40 is connected to the source of the transistor Q12, while the other and of the resistance R40 is connected to the drain of the transistor Q13.

Since the circuit of the fourth example operates in substantially thee come way as the circuit of the first example, only the operation, different from that of the first example, resulting from the addition of the resistance R40 will be described below.

In a steady state (or a state where a virtual short is held), the resistance value of the resistance R40 is set such that all of the drain current of the translator Q13, for supplying a bias current, flows through the transistor Q11. As a result, a voltage between the gate and the source of the transistor Q12 does not exceed a predetermined threshold value, so that the transistor Q12 is out off. Since the drain current of the transistor Q12 does not flow, the current mirror circuit 14 does not supply a current to the nods OUT. In thin case, by providing the resistance R40, the following effects can be attained: when the virtual short is held, the current mirror circuit in completely cut off by the resistor R40.

EXAMPLE 5

Figure 5:
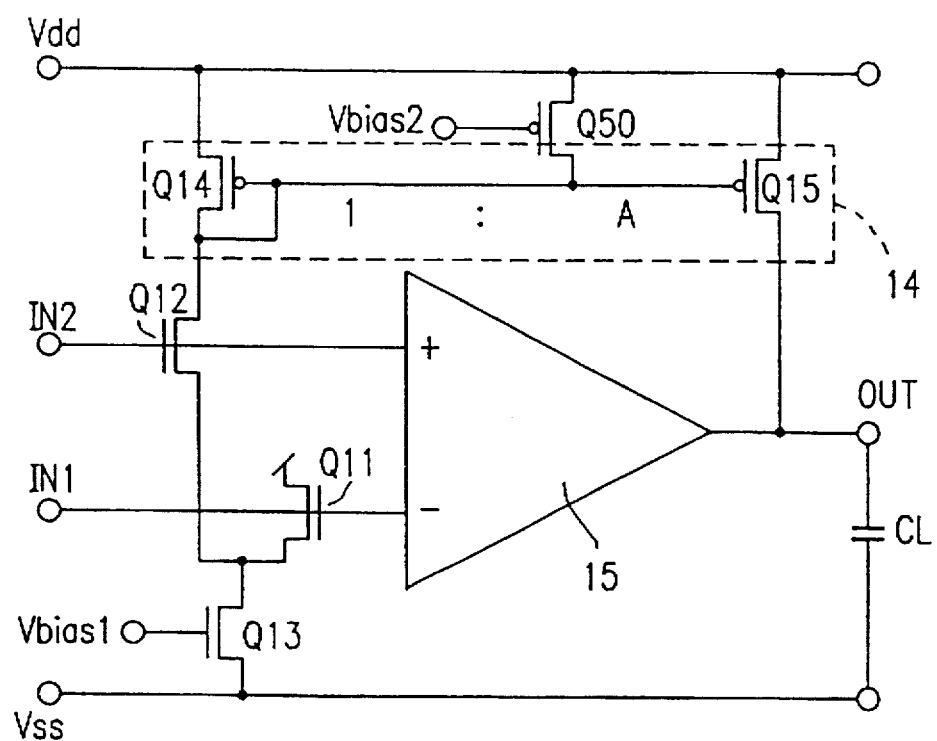
FIG. 5 is a circuit diagram of an operational amplifier apparatus in a fifth example according to the present invention.

FIG. 5 is a circuit diagram of an operational amplifier apparatus in a fifth example according to the present invention. The circuit of the fifth example has the same configuration as that of the circuit of the first example, except that a translator Q50 is provided between the gates of the transistors Q14 and Q15 and the power supply Vdd. A bias voltage Vbias2 is applied to the gate of the transistor Q50. The source of the transistor Q50 is connected to the power supply Vdd, while the drain of the transistor Q50 is connected to the gates of the transistors Q14 and Q15.

Since the circuit of the fifth example operates in substantially the same way as the circuit of the first example, only the operation, different from that of the first example, resulting from the addition of the transistor Q50 will be described below.

In a steady state (or a state where a virtual short is held), the drain currant of the transistor Q12 is almost zero, so that the transistor Q50 functioning as a constant current source substantially pulls up the voltages of the gates of the transistors Q14 and Q15 of the current mirror circuit 14 to the power supply Vdd. As a result, the transistors Q14 and Q15 are completely cut off and therefore, it is possible to prevent a current from leaking from the current mirror circuit 14 to the nods OUT in the steady state.

In a non-steady state (or a state where VIN2>VIN1 is satisfied because of the variation in the voltages of the nodes IN1 and IN2, for example), when a difference voltage between VIN1 and VIN2 (i.e., VIN2−VIN1) exceeds a predetermined threshold value, a part of the drain current, which has been flowing through the transistor Q11, begins to flow through the transistor Q12, too. When the amount of the drain current of the transistor Q12 (herein indicated as IQ12) exceeds the amount of the drain current of the transistor Q50 (herein indicated as IQ50), the current mirror circuit 14 amplifies a current in an amount of (IQ12−IQ50) by A, and then outputs the amplified current to the nods OUT. As a result, the load capacitance CL in rapidly charged and the slew rate in the nods OUT can be considerably improved.

Figure 10:
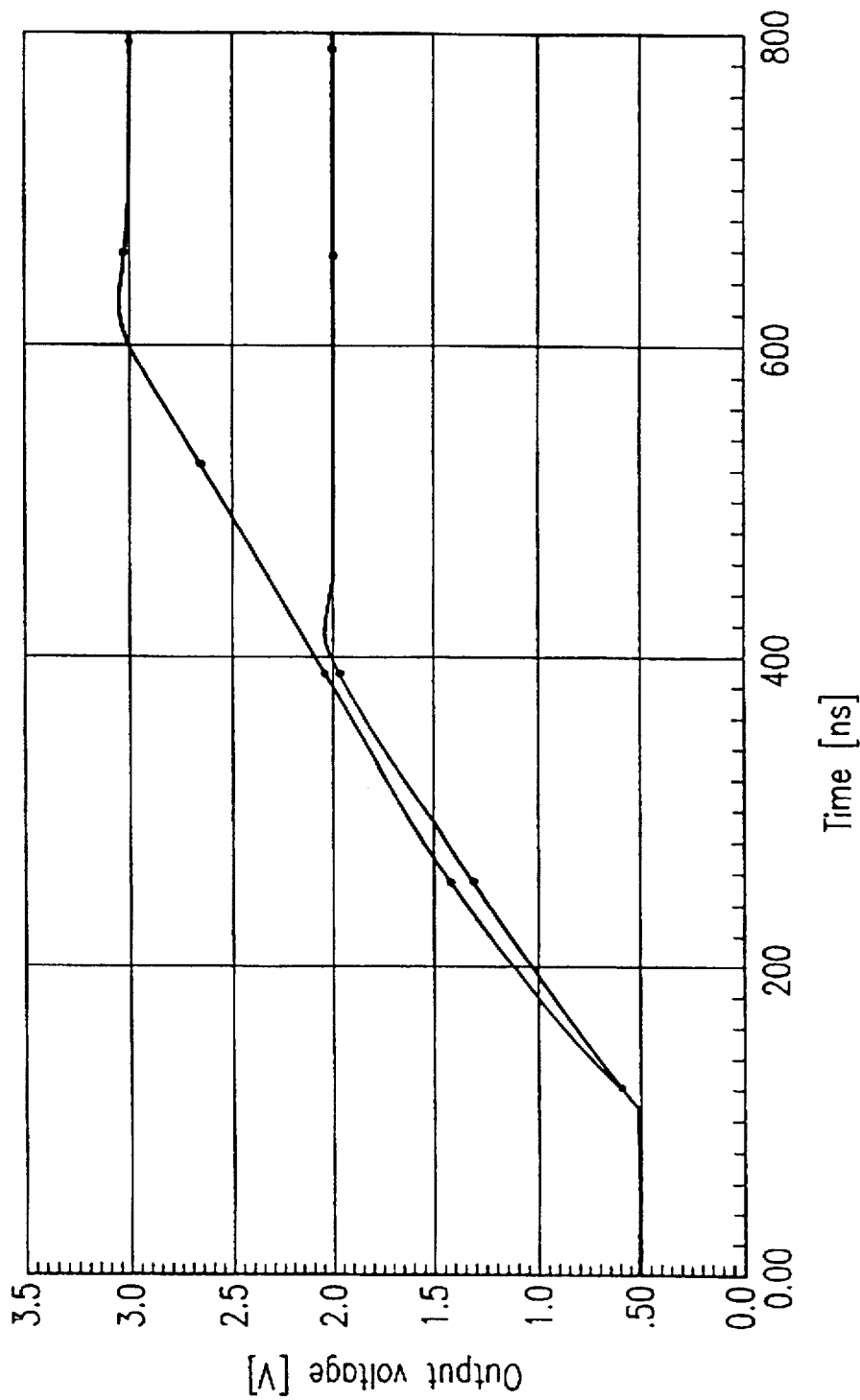
FIG. 10 is a graph showing a vicinity of a leading edge of an output signal in a conventional operational amplifier apparatus.

Hereinafter, the rise characteristics of an operational amplifier apparatus according to the present invention will be compared with those of a conventional operational amplifier apparatus. FIG. 10 is a graph showing a vicinity of a leading edge of an output signal in a conventional operational amplifier apparatus. The voltage of an input signal varies stepwise from 0.5 V at a time T (=100 ns) into 2.0 V and then 3.0 V. The operation of a voltage follower configured as an exemplary conventional operational amplifier apparatus using the circuit shown in FIG. 6 was simulated. The consumed current is 100 μA and the load capacitance CL is 15 pF. As shown in FIG. 10, the leading edge cannot vary abruptly but gradually owing to the load capacitance CL. In other words, the edge of the input signal which has varied stepwise becomes less sharp (or the input signal is distorted).

Figure 8:
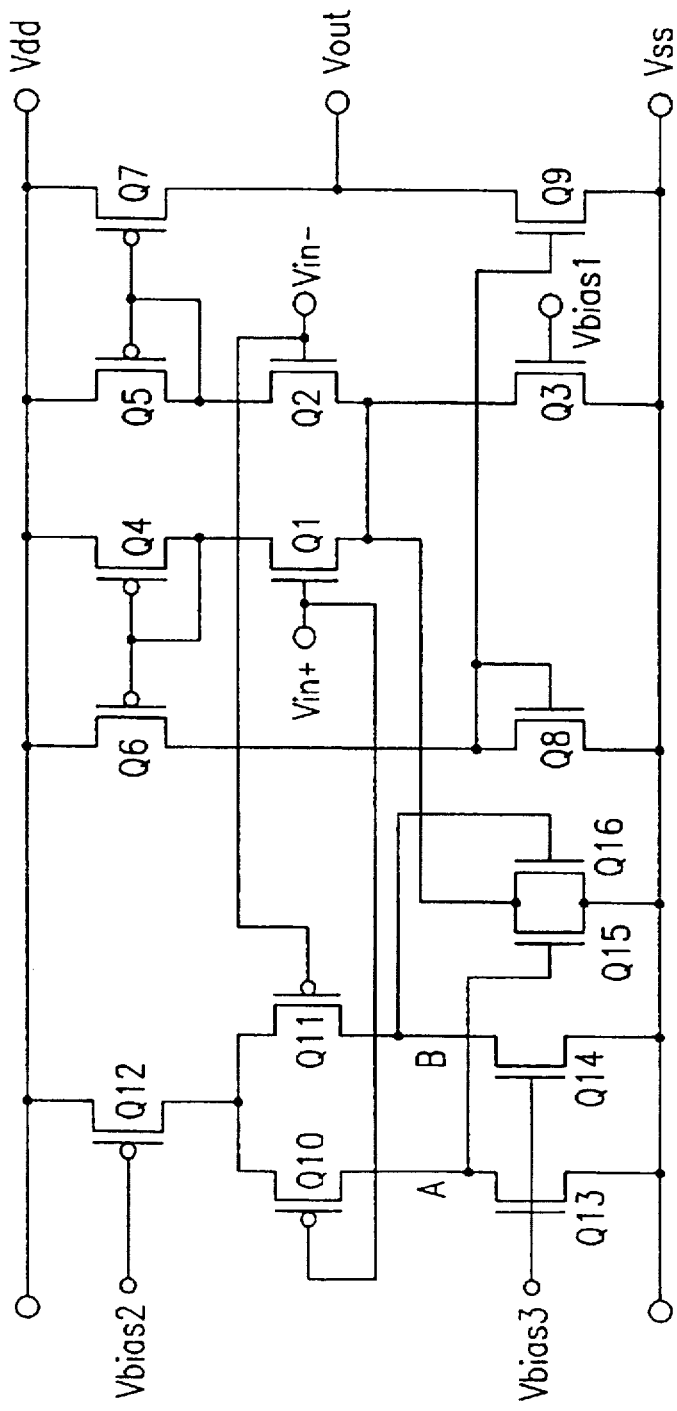
FIG. 8 in a circuit diagram of still another conventional operational amplifier apparatus.
Figure 9:
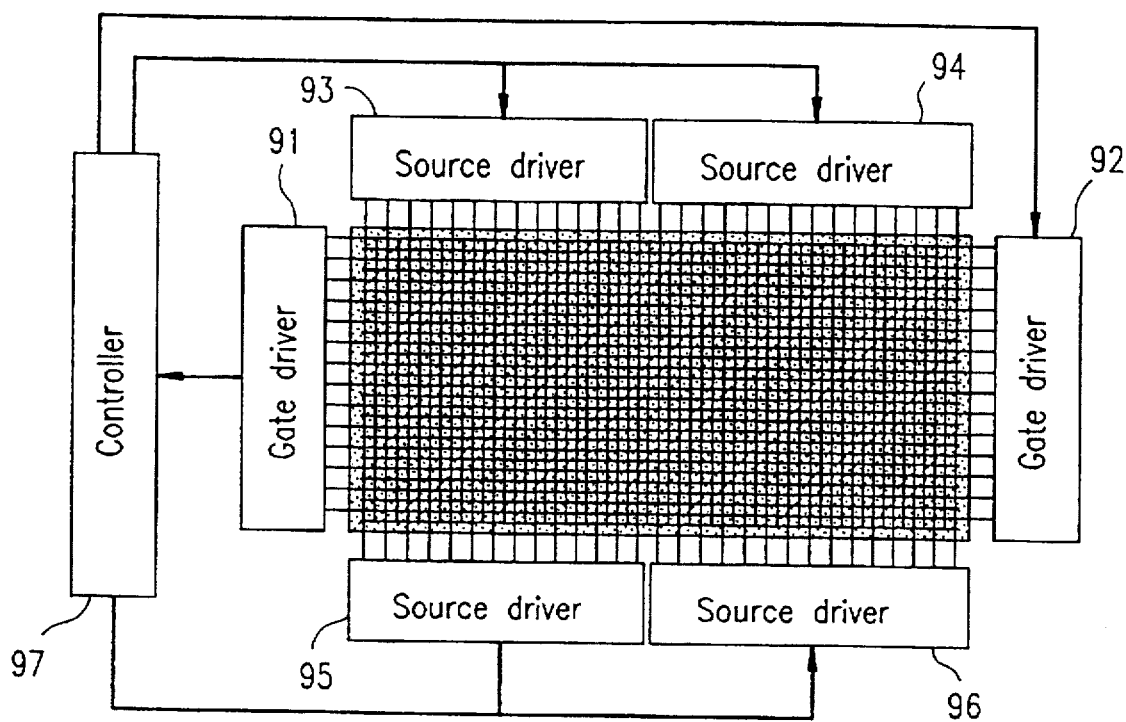
FIG. 9 is a schematic representation of a driving system for a liquid crystal panel.
Figure 11:
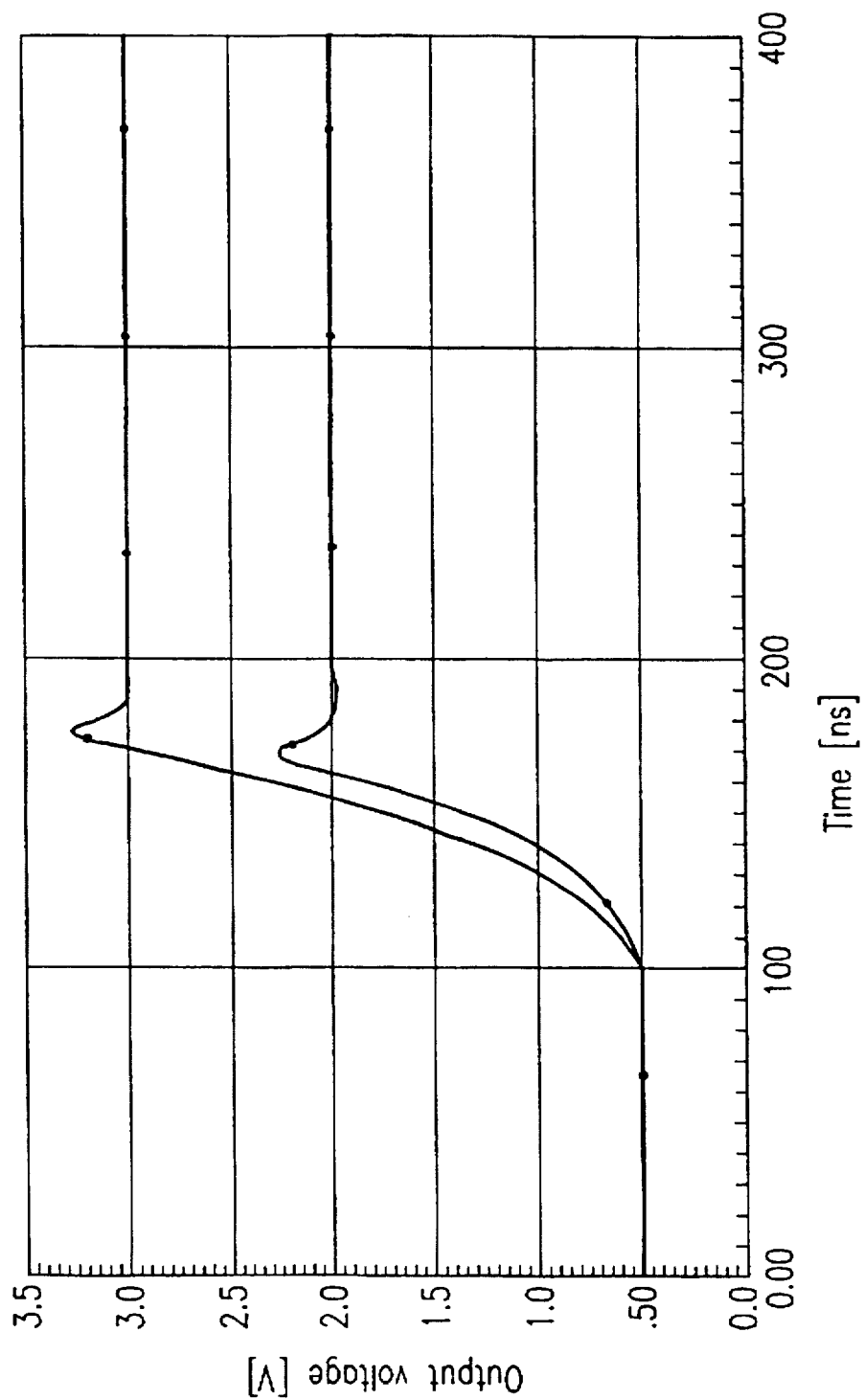
FIG. 11 is a graph showing a vicinity of a leading edge of an output signal in an operational amplifier apparatus formed by combining the circuits shown in FIGS. 6 and 8.
Figure 12:
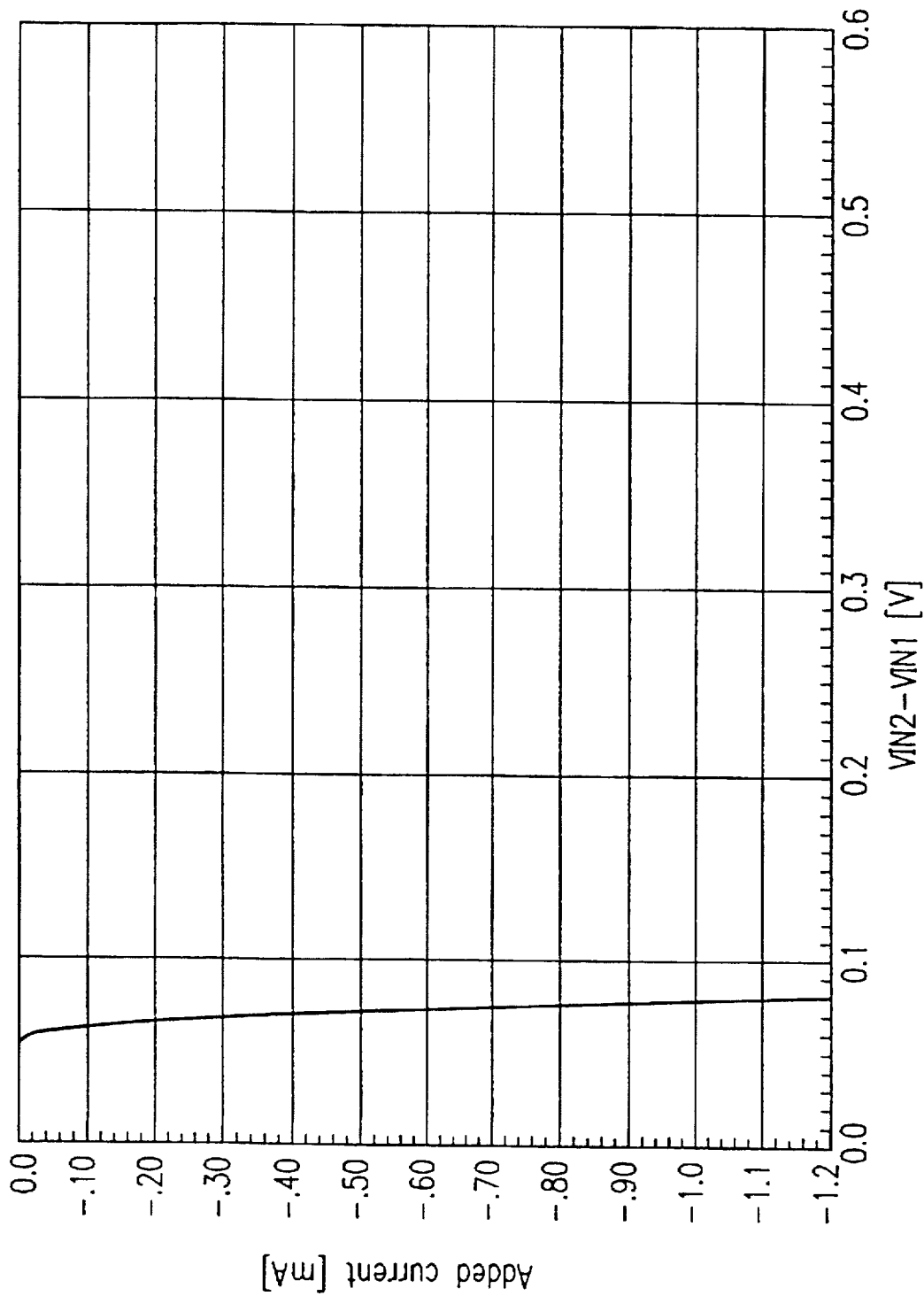
FIG. 12 is a graph showing a current to be added in a simulated conventional operational amplifier apparatus.

Another conventional example will be described. FIG. 11 is a graph showing a vicinity of a leading edge of an output signal in an operational amplifier apparatus formed by combining the circuits shown in FIGS. 6 and 8. A similar input signal to that of FIG. 10 is applied. In the steady state, the consumed current is assumed to be increased by 10 μA. As shown in FIG. 11, the slew rate itself has been improved to a certain degree, but an overshoot is generated to the contrary. This is because, in the circuit shown in FIG. 8, when a difference between the voltages in the two input terminals exceeds a threshold value, the amount of current to be added drastically increases. FIG. 12 is a graph showing a current to be added to a simulated conventional operational amplifier apparatus. In FIG. 12, the abscissas indicate a difference between the voltages in the input terminals, while the ordinates indicate a current to be added. Since the transistors used for a current mirror circuit are PMOS transistors, a negative sign is added to a current value. As shown in FIG. 12, since an overshoot is likely to be generated in this circuit, the settling characteristics thereof are adversely low and a noise is likely to be caused therein.

Figure 13:
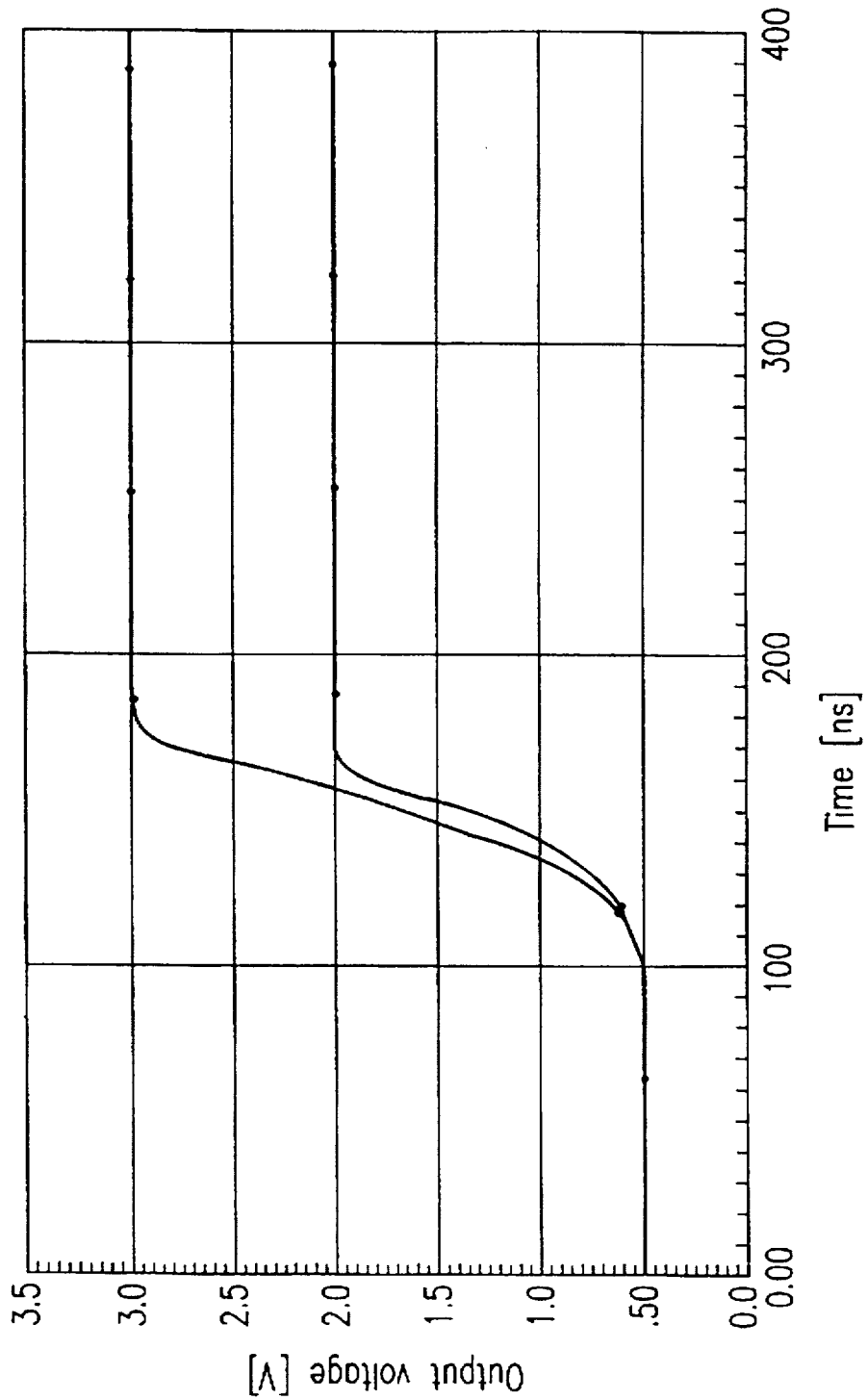
FIG. 13 is a graph showing a vicinity of a leading edge of an output signal in the operational amplifier apparatus shown in FIG. 1 according to the present invention.
Figure 14:
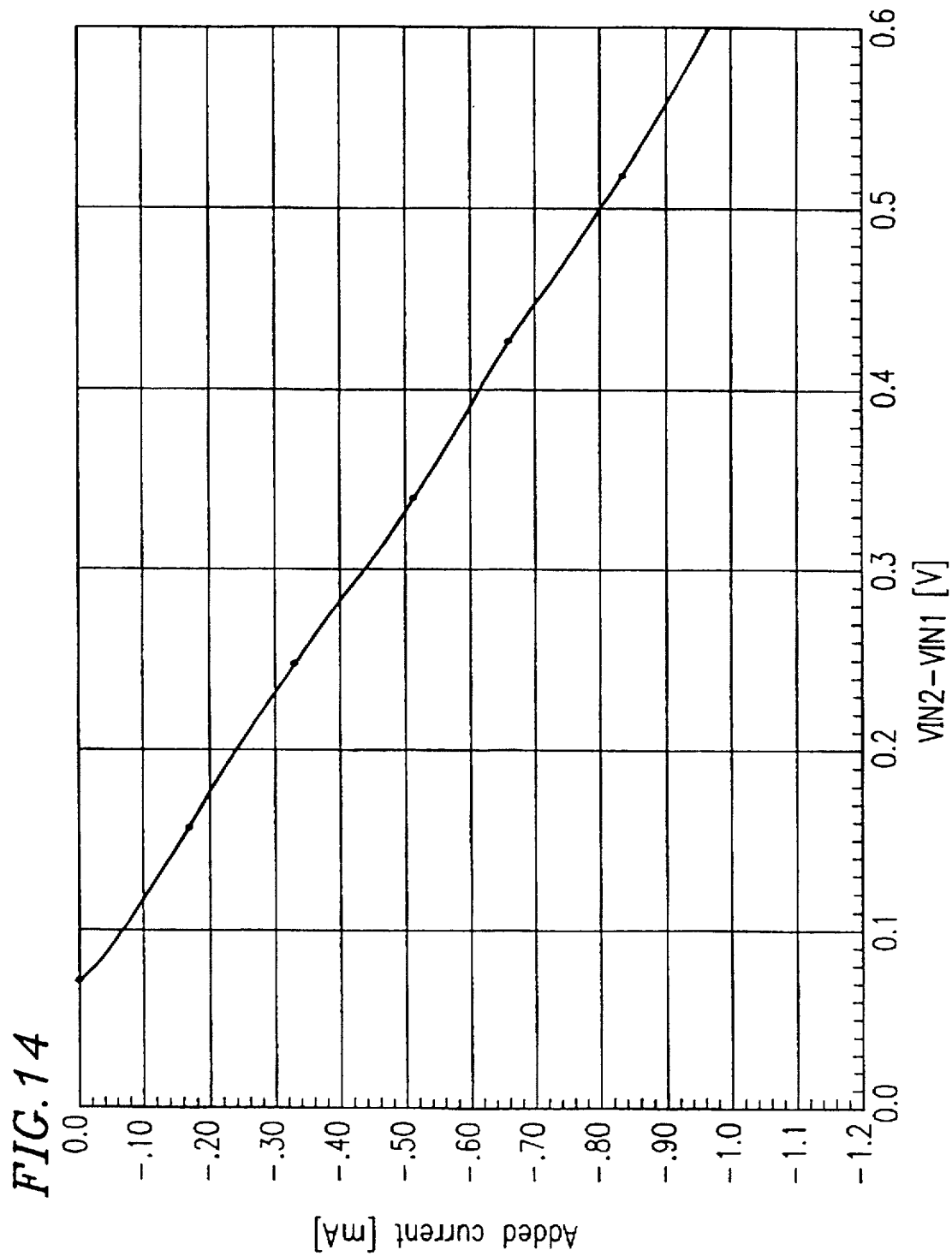
FIG. 14 is a graph showing a current to be added in the simulated operational amplifier apparatus according to the present invention.

FIG. 13 is a graph showing a vicinity of a leading edge of an output signal in the operational amplifier apparatus shown in FIG. 2 according to the present invention. A similar input signal to that of FIG. 10 is applied. In the steady state, the consumed current is assumed to be increased by 10 μA. As shown in FIG. 13, according to the present invention, a large slew rate is realized without degrading the settling characteristics. This in because the operational amplifier apparatus of the invention supplies a current, which is a first-order function of a voltage difference between the two input terminals, to the output terminal. FIG. 14 is a graph showing a current to be added to the simulated operational amplifier apparatus according to the present invention. As shown in FIG. 14, when a voltage difference between the input terminals exceeds a threshold value, the current to be added increases substantially as a first-order function of the voltage difference. Therefore, it is possible to considerably improve the slew rate without degrading the settling characteristics.

Figure 6:
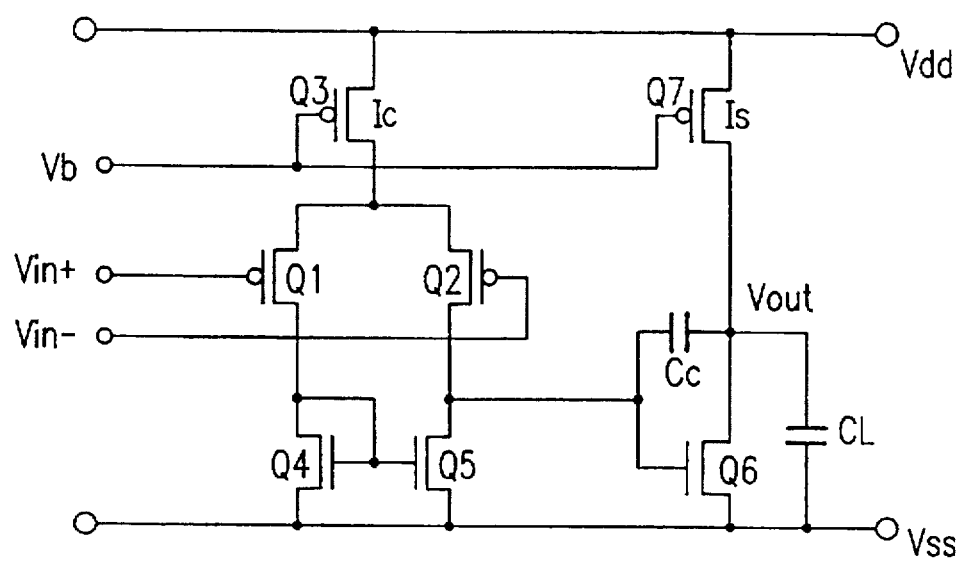
Figure 7:
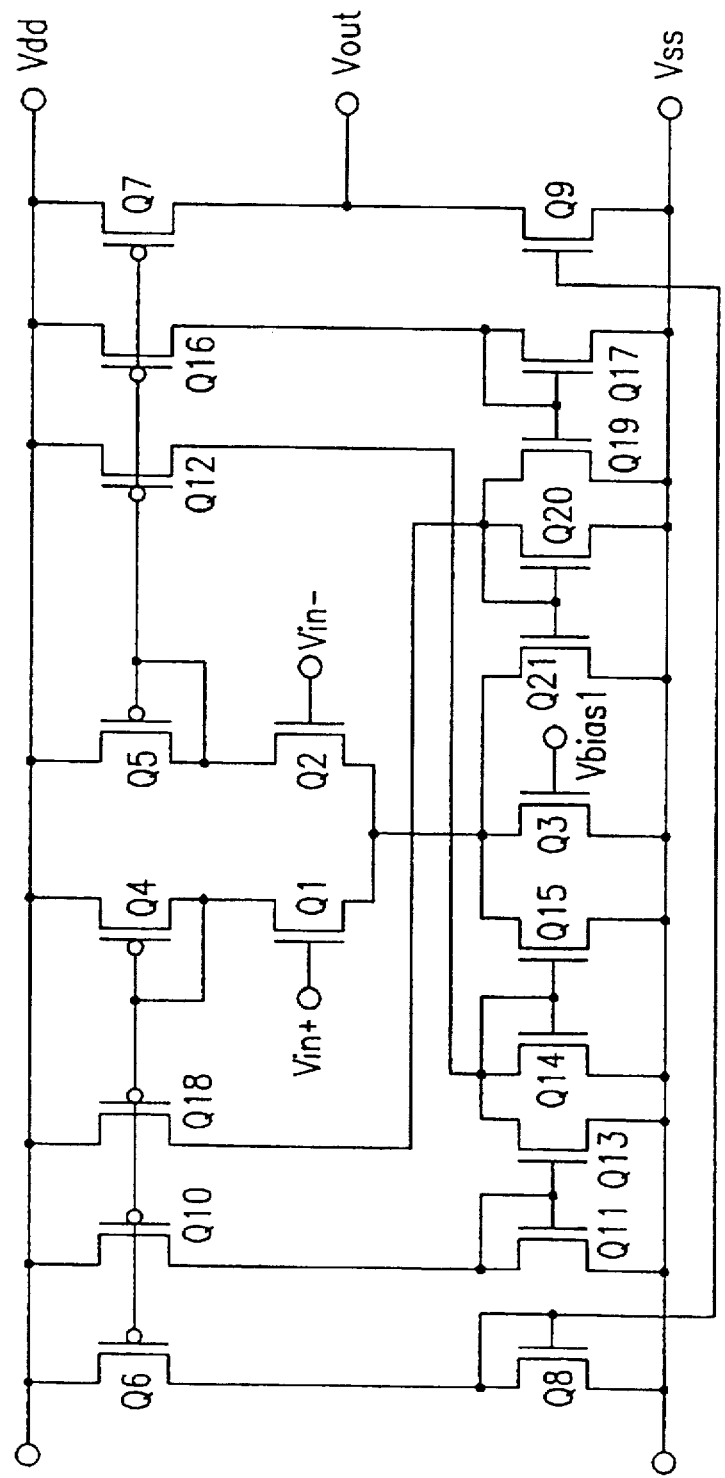
FIG. 7 is a circuit diagram of another conventional operational amplifier apparatus.

On the other hand, in order to realize the same slew rate as that shown In FIG. 13 by the conventional circuit shown in FIG. 6, a steady current of about 1 mA cannot but be used. Conversely speaking, according to the present invention, an operational amplifier apparatus with excellent slew rate and settling characteristics is realizable at an extremely low consumed current (or power consumption).

According to the present invention, at least the following effects can be attained. When a difference voltage between a non-inverted input terminal and an inverted input terminal exceeds a threshold value, a current mirror circuit supplies a current, which is represented as a first-order function of the difference voltage, to an output terminal. As a result, a slew rate of an operational amplifier apparatus can be considerably improved without significantly increasing the power consumption or degrading the small signal characteristics and the like.

In the specification, the load capacitance can be any capacitive load connected to the output terminal of the operational amplifier apparatus. Therefore, the load capacitance includes an LCD matrix connected to the output terminal, a parasitic capacitance of a wire connected to the output terminal, and the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An operational amplifier apparatus for outputting to an output terminal a voltage corresponding to a difference between a voltage in a first input terminal and a voltage in a second input terminal, comprising:

an operational amplifying section for outputting to the output terminal a voltage corresponding to k (V2−V1), where V1 is the voltage in the first input terminal, V2 is the voltage in the second input terminal and k is a constant, and a current supply section for supplying a current corresponding to the difference between the voltage in the first input terminal and the voltage in the second input terminal, wherein the current supply section supplies a current to at least one of a capacitor included in the operational amplifying section and the output terminal, thereby increasing a slew rate.

2. An operational amplifier apparatus according to claim 1, wherein the current supply section does not supply a current when the voltage in the first input terminal is equal to the voltage in the second input terminal and supplies a current corresponding to the difference between the voltage in the first input terminal and the voltage in the second input terminal when the voltage in the first input terminal is not equal to the voltage in the second input terminal.

3. An operational amplifier apparatus according to claim 1, wherein the current supply section comprises: a first transistor, a control terminal of which is connected to the first input terminal; a second transistor, a control terminal of which is connected to the second input terminal; and a current mirror circuit for supplying a current which is A times an large as a current flowing through terminals other than the control terminal of the second transistor.

4. An operational amplifier apparatus according to claim 3, wherein a relationship W1/L1>W2/L2 (where a channel width and a channel length of the first transistor are denoted by W1 and L1, respectively, and a channel width and a channel length of the second transistor are denoted by W2 and L2, respectively) is satisfied.

5. An operational amplifier apparatus according to claim 3, wherein a relationship Vt1<Vt2 (where threshold voltages of the first and the second transistors are denoted by Vt1 and Vt2, respectively) is satisfied.

6. An operational amplifier apparatus according to claim 3, wherein the current supply section comprises a transistor, a control terminal and one of terminals other than the control terminal of which are connected to one of the terminals other than the control terminal of the second transistors.

7. An operational amplifier apparatus according to claim 3, wherein the current supply section comprises a resistance connected to one of the terminals other than the control terminal of the second transistor.

8. An operational amplifier apparatus according to claim 3, wherein a constant current source is connected to an input of the current mirror circuit.

9. An operational amplifier apparatus according to claim 1, wherein the current supply section supplies a current to the capacitor included in the operational amplifying section and the output terminal.

* * * * *